(12) United States Patent
Sukegawa

(10) Patent No.: US 7,826,036 B2
(45) Date of Patent: Nov. 2, 2010

(54) SCANNING EXPOSURE APPARATUS AND METHOD OF MANUFACTURING DEVICE

(75) Inventor: Takashi Sukegawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 36 days.

(21) Appl. No.: 12/326,391

(22) Filed: Dec. 2, 2008

(65) Prior Publication Data

US 2009/0147231 A1 Jun. 11, 2009

(30) Foreign Application Priority Data

Dec. 6, 2007 (JP) ............................. 2007-316358

(51) Int. Cl.
*G03B 27/54* (2006.01)
*G03B 27/72* (2006.01)

(52) U.S. Cl. .......................... 355/67; 355/69

(58) Field of Classification Search .................. 355/52, 355/53, 55, 67–71; 250/548; 356/399–401
See application file for complete search history.

(56) References Cited

U.S. PATENT DOCUMENTS

| 6,493,066 | B1 | 12/2002 | Miwa | |
|---|---|---|---|---|
| 7,212,275 | B2 * | 5/2007 | Ohtsuki | 355/67 |
| 7,477,356 | B2 * | 1/2009 | Asaishi | 355/69 |
| 2003/0227607 | A1 * | 12/2003 | Kato et al. | 355/53 |
| 2005/0190801 | A1 | 9/2005 | Sukegawa et al. | |

FOREIGN PATENT DOCUMENTS

| JP | 2576798 A | 7/1995 |
|---|---|---|
| JP | 11-243050 A | 9/1999 |
| JP | 2005-191503 A | 7/2005 |

* cited by examiner

*Primary Examiner*—Hung Henry Nguyen
(74) *Attorney, Agent, or Firm*—Canon U.S.A., Inc., IP Division

(57) ABSTRACT

A scanning exposure apparatus according to this invention has a light source which can change the central wavelength of exposure light to undergo pulsed oscillation, and scan-exposes a substrate with slit-like exposure light while periodically changing the central wavelength in synchronism with the pulsed oscillation of the exposure light. The scanning exposure apparatus includes a controller which controls the light source so that integrated values Sws and Swl obtained by integrating the intensity of the exposure light for each wavelength in the scanning direction in a short-wavelength range and long-wavelength range, respectively, assuming a target central wavelength as a reference satisfy:

$|(Sws-Swl)/(Sws+Swl)| \leq 0.1$.

5 Claims, 6 Drawing Sheets

SCANNING EXPOSURE APPARATUS AND METHOD OF MANUFACTURING DEVICE

BACKGROUND OF THE INVENTION

1. Field of the Invention

The present invention relates to a scanning exposure apparatus and a method of manufacturing a device.

2. Description of the Related Art

A reduction projection exposure apparatus has conventionally been employed in a process of manufacturing semiconductor devices such as an LSI and VLSI formed from ultrafine patterns. This apparatus reduces a circuit pattern drawn on a mask (reticle) and projects and prints it by exposure on a substrate (wafer) coated with a photosensitive agent, thereby forming a desired pattern on the substrate.

Along with an improvement in the packaging density of semiconductor devices, further advance of micropatterning is required. This demand is increasing even for the exposure apparatus along with the development of the resist process.

To improve the resolution of the exposure apparatus, there are a method of shortening the exposure wavelength and a method of increasing the numerical aperture (NA) of the reduction projection optical system. As the resolution improves, the depth of focus of the reduction projection optical system decreases. Therefore, it is an important issue to attain both an improvement in resolution and the assurance of the depth of focus necessary for the process involved.

Japanese Patent No. 2576798 discloses a technique of attaining both an improvement in resolution and the assurance of the depth of focus by synchronizing a change in the central wavelength of the exposure light and the pulsed oscillation of the exposure light using the chromatic aberration of the projection optical system, and integrating images formed at different positions.

However, the scanning exposure apparatus adjusts the exposure amount integrated within the scanning time to be constant against nonuniformity of the illumination light by changing the width of the aperture and the light intensity in the aperture in a direction perpendicular to the scanning exposure direction. In this case, the light intensity in the aperture in a direction perpendicular to the scanning direction is often nonuniform.

Even when the technique disclosed in Japanese Patent No. 2576798 is applied to a scanning exposure apparatus which generates a nonuniform light intensity distribution in the slit aperture in a direction perpendicular to the scanning exposure direction, a wavelength vs. intensity distribution obtained by integrating the intensity by changing the central wavelength of the exposure light changes depending on the position in the aperture. The variation in wavelength vs. integrated intensity distribution is a difference in integrated focus distribution, which causes a variation in best imaging position depending on the position in the aperture and the scanning exposure integration position. This often results in a decrease in the depth of focus common in the entire scanning exposure field.

SUMMARY OF THE INVENTION

It is an object of the present invention to provide a scanning exposure apparatus which attains both a high resolution and a sufficiently large depth of focus.

According to the present invention, there is provided a scanning exposure apparatus which includes a light source which can change a central wavelength of exposure light to undergo pulsed oscillation, and scan-exposes a substrate with slit-like exposure light while periodically changing the central wavelength in synchronism with the pulsed oscillation of the exposure light, the apparatus comprising:

a controller configured to control the light source so that integrated values Sws and Swl obtained by integrating an intensity of the exposure light for each wavelength in a scanning direction in a short-wavelength range and long-wavelength range, respectively, assuming a target central wavelength as a reference satisfy:

$$|(Sws-Swl)/(Sws+Swl)| \leq 0.1.$$

According to the present invention, it is possible to provide a scanning exposure apparatus which attains both a high resolution and a sufficiently large depth of focus.

Further features of the present invention will become apparent from the following description of exemplary embodiments with reference to the attached drawings.

DESCRIPTION OF THE EMBODIMENTS

Embodiment of Scanning Exposure Apparatus

Figure 1:
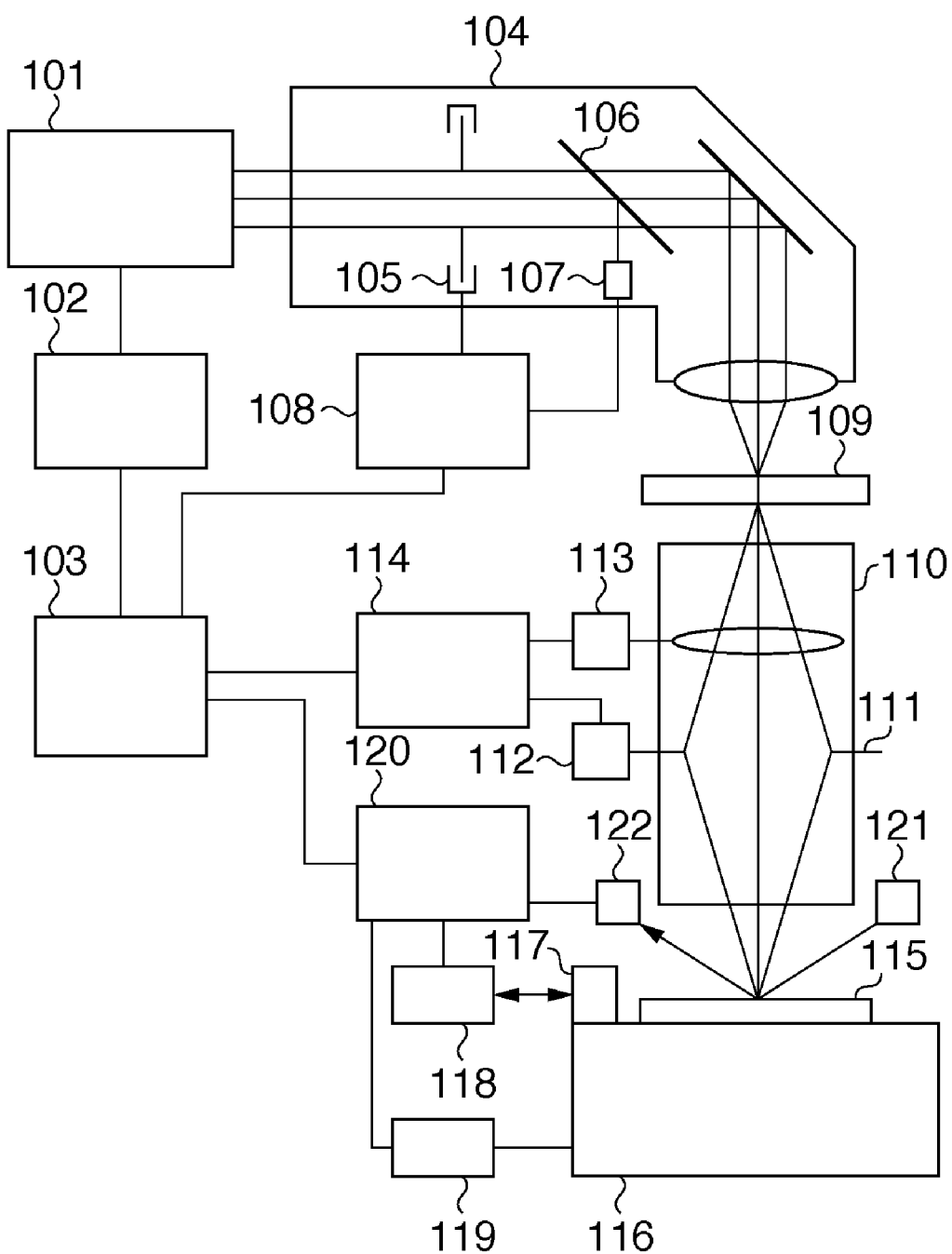
FIG. 1 is a schematic block diagram showing an example of a scanning exposure apparatus according to the present invention.

FIG. 1 shows the schematic arrangement of a scanning exposure apparatus according to an embodiment of the present invention. A light source 101 is, for example, an ArF or KrF excimer laser light source. The light source 101 performs pulsed oscillation of light with a far-ultraviolet wavelength of 193 nm or 248 nm. The light source 101 includes, for example, a front mirror which constitutes a resonator, a wavelength range narrowing module which includes, for example, a diffraction grating and prism, a monitor module, and a shutter. The diffraction grating narrows the exposure wavelength range. The monitor module includes, for example, a spectroscope and detector for monitoring the wavelength stability and spectral width. The central wavelength of exposure light emitted by the light source 101 can be changed. The light source 101 also includes an actuator with a high response characteristic, for changing the central wavelength of the exposure light in synchronism with the pulsed oscillation of the excimer laser by changing the incident angle with respect to the diffraction grating.

A light source controller 102 performs, for example, control of the gas exchange operation of the light source 101, wavelength stabilization control, and control of a discharge application voltage. In this embodiment, these types of control are performed not only by the light source controller 102 but also in response to a command from a main controller 103 which is connected to the scanning exposure apparatus via an interface cable and controls the overall scanning exposure apparatus.

A beam emitted by the light source 101 is shaped into a predetermined beam shape via a beam shaping optical system (not shown) of an illumination optical system 104, enters an optical integrator (not shown), and forms a large number of secondary light sources to illuminate a reticle 109 with a uniform illuminance distribution.

An aperture stop 105 of the illumination optical system 104 has a nearly circular aperture. An illumination system controller 108 sets the aperture diameter of the aperture stop 105 and, eventually, the numerical aperture (NA) of the illumination optical system 104 to desired values. Since the ratio of the numerical aperture of the illumination optical system 104 to that of a reduction projection optical system 110 is the coherence factor ($\sigma$ value), the illumination system controller 108 can set the $\sigma$ value by controlling the aperture stop 105 of the illumination optical system 104.

A half mirror 106 is inserted into the optical path of the illumination optical system 104. A certain component of the exposure light, which illuminates the reticle 109, is reflected and extracted by the half mirror 106. An ultraviolet light photosensor 107 is inserted into the optical path of the light component reflected by the half mirror 106, and generates an output corresponding to the intensity of the exposure light (exposure energy).

The output from the photosensor 107 is converted into exposure energy per pulse by an integration circuit (not shown) which performs integration for each pulse emission of the light source 101. The converted exposure energy is input to the main controller 103 which controls the overall scanning exposure apparatus via the illumination system controller 108.

The circuit pattern of a semiconductor device to be printed is formed on the reticle (mask) 109 serving as an original, which is irradiated with the exposure light by the illumination optical system 104. The reduction projection optical system 110 reduces the circuit pattern image of the reticle 109 at a reduction magnification $\beta$ ($\beta$ is, e.g., ¼) and projects and forms the reduced image in one shot region on a wafer 115 serving as a photosensitive substrate coated with a photoresist.

An aperture stop 111 of the reduction projection optical system 110, which has a nearly circular aperture, is inserted on the pupil plane (the Fourier transformation plane with respect to the reticle) of the reduction projection optical system 110. A driving mechanism 112 such as a motor controls the aperture diameter of the aperture stop 111 to a desired value.

A field lens driving mechanism 113 moves a field lens as a constituent element of the lens system in the reduction projection optical system 110 onto the optical axis of the reduction projection optical system 110 using, for example, the air pressure or a piezoelectric element. The field lens driving mechanism 113 reduces distortion errors by ensuring a satisfactory projection magnification while preventing deterioration in various aberrations of the reduction projection optical system 110. The driving mechanisms 112, 113 are controlled by a controller 114.

A substrate stage (wafer stage) 116 can three-dimensionally move along the optical axis direction (Z direction) of the reduction projection optical system 110 and on a plane (X-Y plane) perpendicular to this direction. A laser interferometer 118 measures the distance between the wafer stage 116 and a moving mirror 117 fixed on the wafer stage 116, thereby detecting the position of the wafer stage 116 on the X-Y plane.

A stage controller 120 under the control of the main controller 103 of the scanning exposure apparatus detects the position of the wafer stage 116 by the laser interferometer 118, and controls a driving mechanism 119 such as a motor, thereby moving the wafer stage 116 to a predetermined position on the X-Y plane.

A light projecting optical system 121 and detecting optical system 122 constitute a focal plane detector. The light projecting optical system 121 projects a plurality of light beams formed from non-exposure light which does not expose the photoresist on the wafer 115. The light beams are converged on the wafer 115 and reflected by it. The light beams reflected by the wafer 115 enter the detecting optical system 122.

Although not shown, a plurality of position detection light-receiving elements are inserted in the detecting optical system 122 in correspondence with the respective reflected light beams. The light-receiving surface of each position detection light-receiving element is set nearly conjugate to a corresponding light beam reflection point on the wafer 115 by an imaging optical system. A positional shift of the surface of the wafer 115 in the optical axis direction of the reduction projection optical system 110 is measured as a positional shift of the incident light beam on the position detection light-receiving element in the detecting optical system 122.

Figure 2:
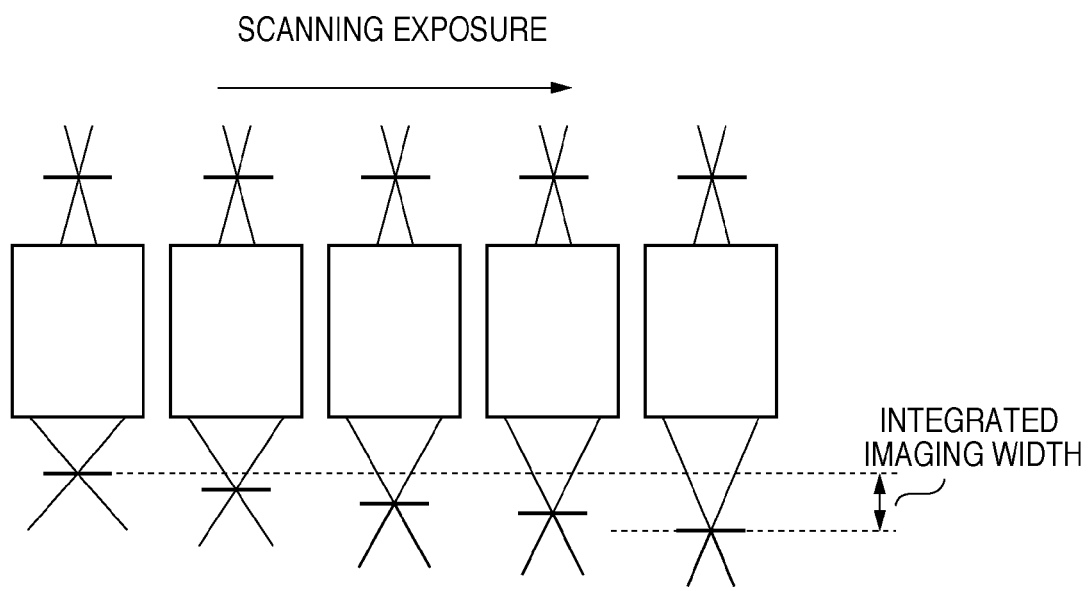
FIG. 2 is a schematic view showing the state in which optical images are integrated by changing the central wavelength of exposure light.
Figure 7:
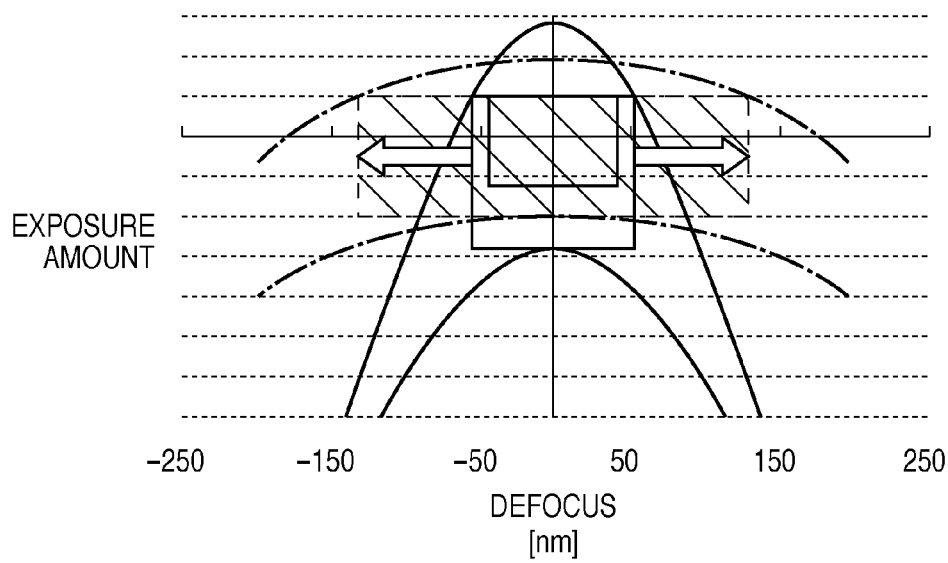
FIG. 7 is a graph showing the state in which the depth of focus is increased by a symmetrical wavelength vs. integrated intensity distribution.

FIG. 2 is a view schematically showing the state in which the focal position changes due to chromatic aberration upon changing the central wavelength in scanning exposure so that optical images are integrated on the optical axis. FIG. 7 is a graph showing the state in which the depth of focus is increased by the method shown in FIG. 2. FIG. 7 shows the relationship between the defocus (focal point) and the exposure amount in response to an allowable change in image. The two, upper and lower curves indicated by lines of the same type represent the upper and lower limits of the image size. Referring to FIG. 7, the larger the rectangular region (allowable region) fit between the two, upper and lower curves indicated by lines of the same type, the larger the exposure margin. The depth of focus in this method means the width (allowable width) of the rectangular region in the abscissa direction. The allowable width of the rectangular region in the abscissa direction when images are integrated in the focus direction by changing the central wavelength (broken line) is larger than that when the central wavelength is not changed (solid line), as can be understood from FIG. 7. A relative increase in this width means an increase in the depth of focus.

Particularly for an isolated pattern in which the transparent portion occupies a relatively small area, the effective depth of focus can be increased by continuously forming optical images in the optical axis direction by widening the integrated wavelength range in scanning exposure, as described in Japanese Patent No. 2576798.

Figure 3:
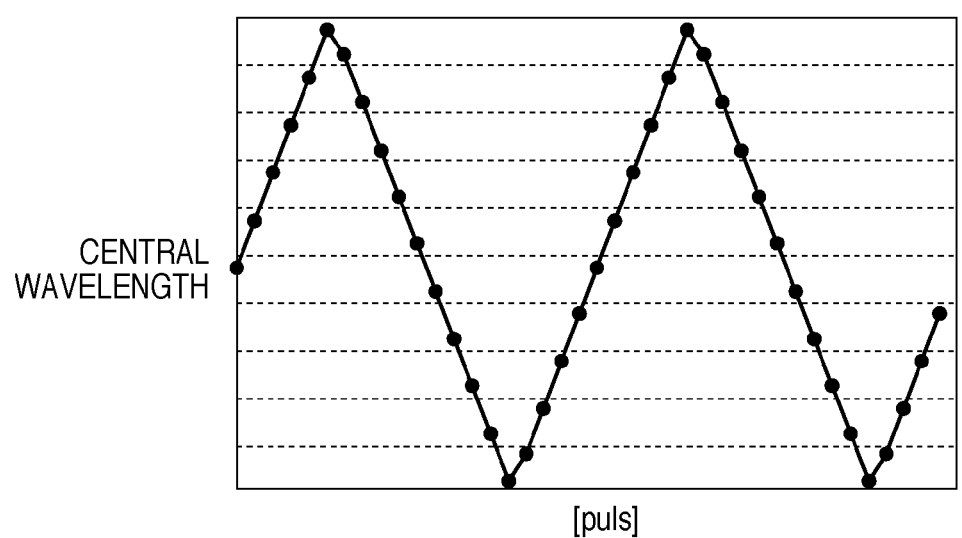
FIG. 3 is a graph showing the driving state of the central wavelength.
Figure 4:
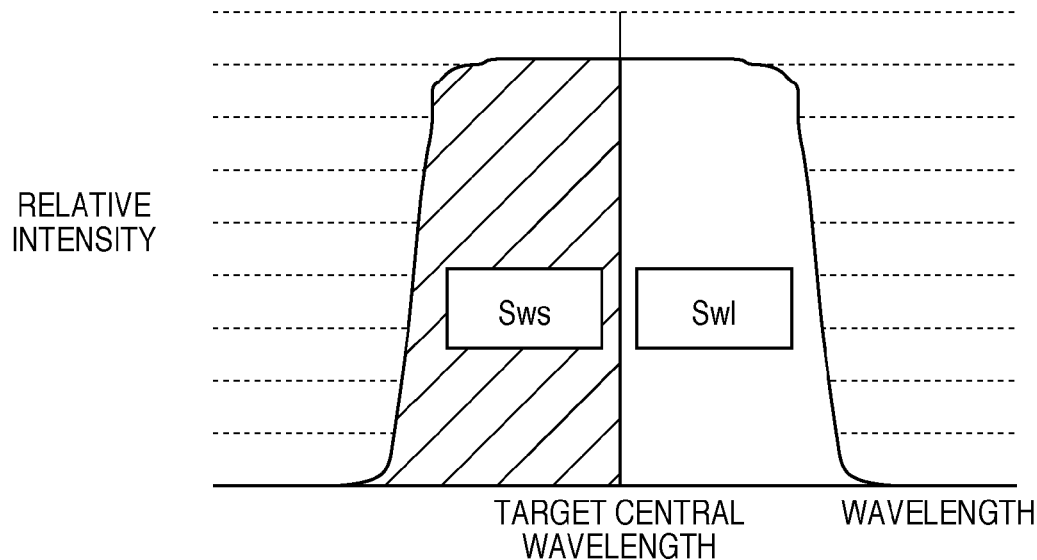
FIG. 4 is a graph showing a symmetrical wavelength vs. integrated intensity distribution.

The symmetry of the wavelength vs. intensity distribution as an integrated value obtained by integrating the intensity of the exposure light for each wavelength in the scanning direction, which is defined by the present invention, will be explained next. FIG. 4 is a graph showing the wavelength vs.

intensity distribution when the central wavelength of the exposure light (laser), the wavelength range of which is narrowed, is periodically changed as shown in FIG. 3. Note that a central wavelength corresponding to half the amplitude of the periodic pattern is assumed to be a targeted reference wavelength, that is, a target central wavelength. Let Sws be an integrated value obtained by integrating the intensity of the exposure light for each wavelength in the scanning direction in a wavelength range including wavelengths shorter than the target central wavelength. Let Swl be an integrated value obtained by integrating the intensity of the exposure light for each wavelength in the scanning direction in a wavelength range including wavelengths longer than the target central wavelength. The inventor of the present invention found that the factor of the wavelength vs. intensity distribution that decreases the common depth of focus, which is a problem in the prior art, is asymmetry between the integrated value (Sws) in the short-wavelength range of the wavelength vs. intensity distribution and the integrated value (Swl) in the long-wavelength range of the wavelength vs. intensity distribution.

To adjust the exposure amount integrated within the scanning time to be constant against nonuniformity of the illumination light, the scanning exposure apparatus changes the width of the aperture and the light intensity in the aperture in a direction perpendicular to the scanning exposure direction. In this case, the light intensity distribution in the aperture in a direction perpendicular to the scanning direction is often nonuniform.

Figure 5:
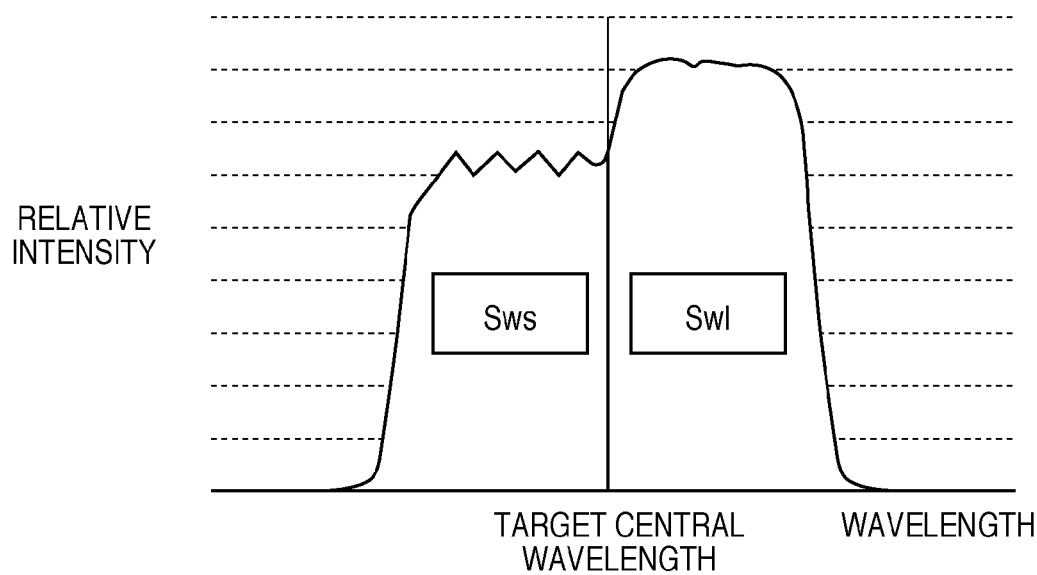
FIG. 5 is a graph showing an asymmetrical wavelength vs. integrated intensity distribution.

As for a difference in the light intensity distribution in the aperture in a scanning exposure apparatus which generates a nonuniform light intensity distribution in the aperture in a direction perpendicular to the scanning direction, the wavelength vs. intensity distribution integrated in the aperture or in the scanning exposure direction cannot be uniformed even by originally necessary central wavelength driving by one period. Also, if the width of the aperture changes for each position in the aperture in a direction perpendicular to the scanning direction, the number of periods integrated changes depending on the position in the aperture. For this reason, the phase of the period integrated in central wavelength driving by scanning changes, resulting in a change in symmetry. FIG. 5 is a graph showing the wavelength vs. intensity distribution in such a case.

When a scanning exposure apparatus which generates a nonuniform light intensity distribution in the aperture in a direction perpendicular to the scanning direction generates an asymmetrical wavelength vs. integrated intensity distribution, this phenomenon cannot be suppressed even by increasing the number of pulses for exposure per period.

Figure 6:
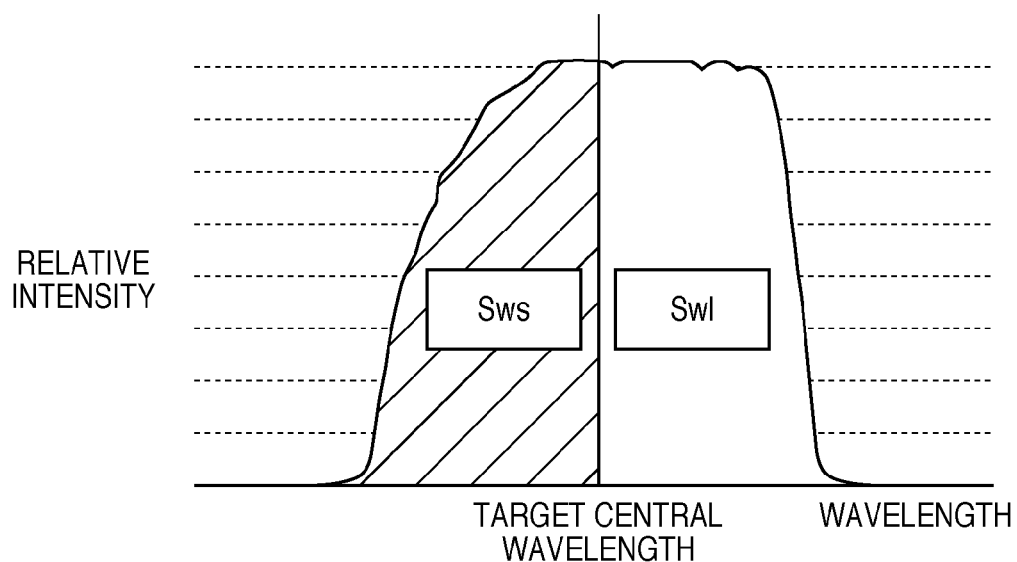
FIG. 6 is a graph showing an asymmetrical wavelength vs. integrated intensity distribution.

FIG. 6 is a graph showing an example of the wavelength vs. integrated intensity distribution integrated assuming that the width of the aperture corresponds to 1.75 periods at a position where this aperture width is larger than that of a position where the aperture is narrowest, which nearly corresponds to one period, in a scanning exposure apparatus in which the width of the aperture changes for each position in a direction perpendicular to the scanning direction. The integrated period number does not become any integral multiple, resulting in degradation in the symmetry of the light intensity distribution, as can be understood from the influence on the light intensity distribution shown in FIG. 6.

Figure 9:
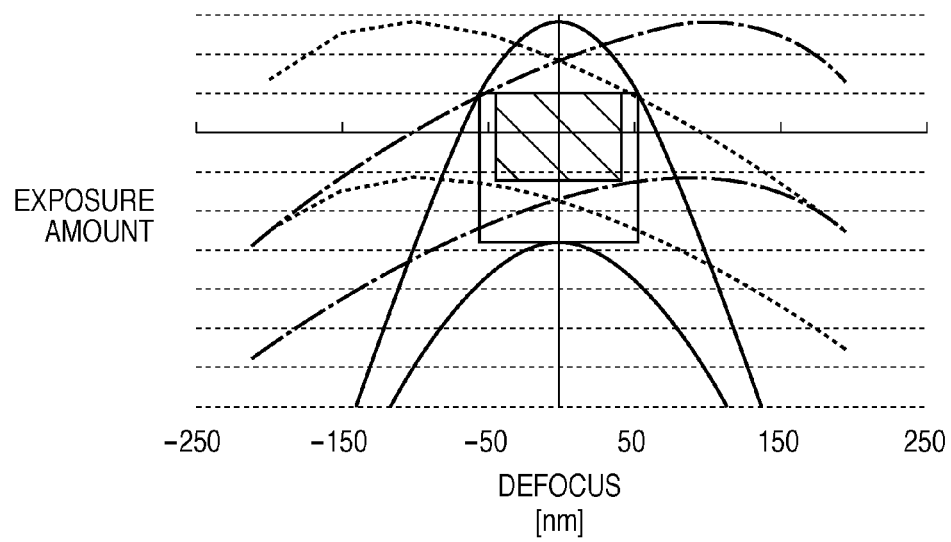
FIG. 9 is a graph showing the state in which the depth of focus is increased by an asymmetrical wavelength vs. integrated intensity distribution.

FIG. 9 shows the effect of increasing the depth of focus in this case in the same form as that shown in FIG. 7. Because of deviation of the wavelength vs. integrated intensity distribution, the peaks of the two, upper and lower curves (dotted lines) are largely shifted to the minus side, so the depth of focus on the plus side is small. Referring to FIG. 9, the depth of focus on the minus side is significantly large. Because the wavelength vs. intensity distribution symmetrically changes with respect to the central wavelength upon integration in the scanning exposure direction, only a region that is common to the two, upper and lower curves (alternate long and short dashed lines) and symmetrical with respect to best focus falls within the allowance in practice. Therefore, a region (hatched region) in which the allowable values on the plus side are the same as those of the minus side is the allowable region. The depth of focus in this case is smaller than that when the wavelength is not changed (solid lines), so no effect of increasing the depth of focus is produced.

To improve the depth of focus by changing the wavelength vs. intensity distribution by periodically changing the central wavelength, it is effective to control the light source so that the asymmetry of the wavelength vs. intensity distribution expressed using Sws and Swl satisfies:

$$|(Sws-Swl)/(Sws+Swl)| \leq 0.1 \tag{1}$$

In the example of the wavelength vs. intensity distribution shown in FIG. 6, the value of |(Sws−Swl)/(Sws+Swl)| is 0.12, that does not satisfy relation (1).

Note that relation (1) is preferably satisfied at all positions in a direction perpendicular to the scanning direction.

Figure 8:
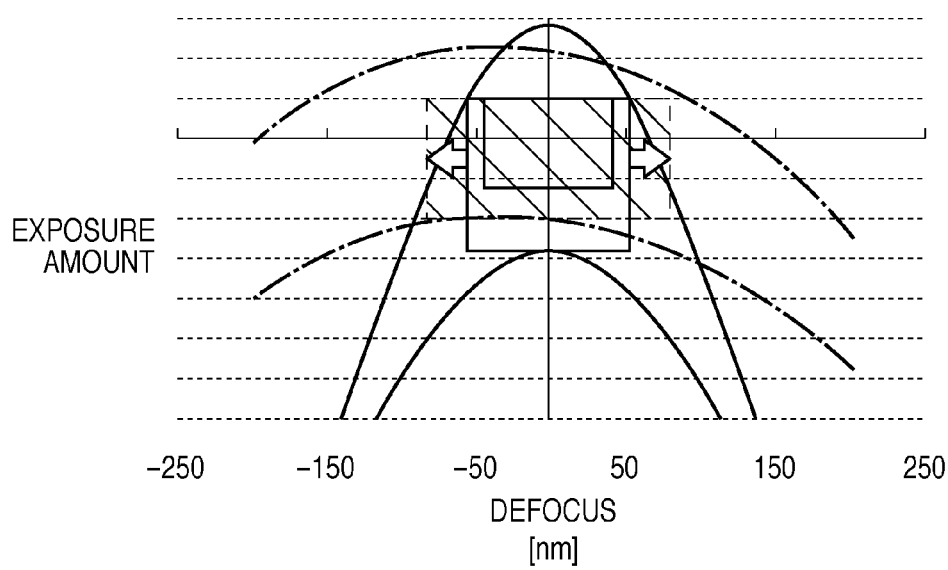
FIG. 8 is a graph showing the state in which the depth of focus is increased by an asymmetrical wavelength vs. integrated intensity distribution.

FIG. 8 is a graph showing the wavelength vs. intensity distribution when a position where the number of periods integrated is smallest corresponds to two periods, that is, the central wavelength of the exposure light which exposes each point on the substrate is changed by two periods. The peaks of the curves (alternate long and short dashed line) are shifted to the minus side because of asymmetry of the wavelength vs. intensity distribution, as in the case shown in FIG. 9. However, the depth of focus in the allowable region (broken line) which takes account of a change in symmetrical wavelength vs. intensity distribution during scanning exposure is larger than that when the wavelength is not changed (solid lines). The value of |(Sws−Swl)/(Sws+Swl)| in the example of the wavelength vs. intensity distribution shown in FIG. 8 is 0.07, which satisfies relation (1).

Figure 10:
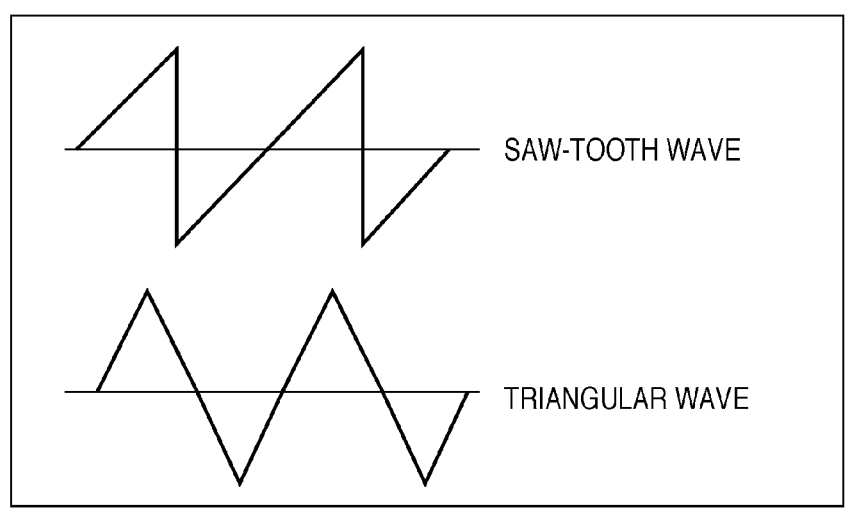
FIG. 10 is a view showing examples of the shape of a periodic waveform for use in the present invention.

As indicated by relation (1), the light source 101 is controlled so that the central wavelength linearly changes with time in a periodic pattern to uniformly distribute the light intensity with respect to the wavelength. FIG. 10 shows examples of a waveform formed by the linear change.

When the light intensity distribution has asymmetry, it is effective to control the light source 101 so that the central wavelength of the exposure light which strikes each point on the substrate in scanning exposure changes by two or more periods.

In this embodiment, the light source controller 102 serves as a controller which controls the light source 101 so that the asymmetry of the wavelength vs. intensity distribution satisfies relation (1), and the central wavelength is integrated for two or more periods in the exposure aperture region.

Embodiment of Manufacture of Device

Devices (e.g., a semiconductor integrated circuit device and liquid crystal display device) are manufactured by a scan-exposure step of scan-exposing a substrate using the scanning exposure apparatus according to the above-described embodiment, a development step of developing the substrate exposed in the scan-exposure step, and other known steps (e.g., etching, resist removal, dicing, bonding, and packaging steps) of processing the substrate developed in the development step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-316358, filed Dec. 6, 2007, which is hereby incorporated by reference herein in its entirety.

What is claimed is:

1. A scanning exposure apparatus which includes a light source which can change a central wavelength of exposure light to undergo pulsed oscillation, and scan-exposes a substrate with slit-like exposure light while periodically changing the central wavelength in synchronism with the pulsed oscillation of the exposure light, the apparatus comprising:

a controller configured to control the light source so that a value Sws, that is obtained by integrating an intensity of the exposure light for each wavelength in a scanning direction in a wavelength range of wavelengths shorter than the center of an amplitude of the central wavelength when periodically changing the central wavelength, and a value Swl, that is obtained by integrating an intensity of the exposure light for each wavelength in a scanning direction in a wavelength range of wavelengths longer than the center of the amplitude, satisfy:

$|(Sws-Swl)/(Sws+Swl)| \leq 0.1$.

2. The apparatus according to claim 1, wherein said controller controls the light source so that the central wavelength of the exposure light which strikes each point on the substrate changes by not less than two periods.

3. The apparatus according to claim 1, wherein said controller controls the light source so that the central wavelength linearly changes with time in a periodic pattern.

4. The apparatus according to claim 1, wherein the light source is one of an ArF excimer laser light source and a KrF excimer laser light source.

5. A method of manufacturing a device, the method comprising:

scan-exposing a substrate using a scanning exposure apparatus;

developing the scan-exposed substrate; and processing the developed substrate to manufacture the device, wherein the scanning exposure apparatus comprises a light source which can change a central wavelength of exposure light to undergo pulsed oscillation, and a controller which controls the light source, and scan-exposes a substrate with slit-like exposure light while periodically changing the central wavelength in synchronism with the pulsed oscillation of the exposure light, and wherein the controller controls the light source so that a value Sws, that is obtained by integrating an intensity of the exposure light for each wavelength in a scanning direction in a wavelength range of wavelengths shorter than the center of an amplitude of the central wavelength when periodically changing the central wavelength, and a value Swl, that is obtained by integrating an intensity of the exposure light for each wavelength in a scanning direction in a wavelength range of wavelengths longer than the center of the amplitude, satisfy:

$|(Sws-Swl)/(Sws+Swl)| \leq 0.1$.

* * * * *